(12) United States Patent
Gilton et al.

(10) Patent No.: US 6,979,653 B1
(45) Date of Patent: Dec. 27, 2005

(54) SEMICONDUCTOR FABRICATION METHODS AND APPARATUS

(75) Inventors: Terry L. Gilton, Boise, ID (US); Li Li, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/579,345

(22) Filed: May 25, 2000

Related U.S. Application Data

(62) Division of application No. 09/321,518, filed on May 27, 1999, now Pat. No. 6,790,783.

(51) Int. Cl.⁷ .......................................... H01L 21/302
(52) U.S. Cl. .................. 438/704; 438/745; 438/750; 134/1.3
(58) Field of Search ................ 438/618, 477, 438/704, 750, 751, 745, FOR 389; 216/41, 216/2, 99; 134/1.3; 257/E21.255

(56) References Cited

U.S. PATENT DOCUMENTS

| | | | | |
|---|---|---|---|---|
| 5,762,755 A | * | 6/1998 | McNeilly et al. | 438/708 |
| 5,785,875 A | * | 7/1998 | Hawthorne et al. | 21/41 |
| 5,929,324 A | * | 7/1999 | Hu et al. | 73/40 |
| 6,024,888 A | * | 2/2000 | Watanabe et al. | 216/73 |
| 6,267,125 B1 | * | 7/2001 | Bergman et al. | 134/102.1 |
| 6,273,108 B1 | | 8/2001 | Bergman et al. | |
| 6,299,696 B2 | * | 10/2001 | Kamikawa et al. | 134/2 |
| 6,406,551 B1 | * | 6/2002 | Nelson et al. | 134/3 |
| 2002/0134409 A1 | * | 9/2002 | Scovell | 134/61 |

FOREIGN PATENT DOCUMENTS

| | | | |
|---|---|---|---|
| JP | 01239933 A | * | 9/1989 |
| WO | 99/52654 | * | 10/1999 |

OTHER PUBLICATIONS

DERWENT-ACC-No.: 2002-415129, Abstract of US20020050279A.*
DERWENT-ACC-No.: 2001-417707, Abstract of WO 200137329A☐☐.*
DERWENT-ACC-No.: 2002-272814, Abstract of JP2001276758A.*
DERWENT-ACC-No.: 1999-611201, Abstract of WO 9952654A.*

* cited by examiner

*Primary Examiner*—George Fourson
(74) *Attorney, Agent, or Firm*—Klarquist Sparkman LLP

(57) ABSTRACT

Methods and apparatus for fabricating and cleaning in-process semi-conductor wafers are provided. An in-process wafer is placed within a closed chamber. A reactant gas is incorporated in a liquid solvent to form a "reactant mixture" that is capable of reacting with photoresist material (or other material) on a wafer surface to facilitate removal of the material from the wafer surface. The reactant mixture is condensed on one or more of the in-process wafer surfaces to form a thin film on the surface(s) of the wafer. The solvent in the reactant mixture acts as a transport medium to place the reactant gas on the wafer surface. The reactant gas is then able to react with the photoresist material (or other material) on the in-process wafer surface to effect removal the material. Following reaction of the reactant gas with the photoresist, the thin film of reactant mixture is removed from the wafer surface by flash heating, rinsing, draining, or other suitable means.

10 Claims, 2 Drawing Sheets

US 6,979,653 B1

SEMICONDUCTOR FABRICATION METHODS AND APPARATUS

This is a division of U.S. patent application Ser. No. 09/321,518, filed May 27, 1999 now U.S. Pat. No. 6,790,783.

FILED OF THE INVENTION

The present invention relates to the field of semiconductor device fabrication and wafer cleaning.

BACKGROUND AND SUMMARY OF THE INVENTION

During the processing of semiconductor wafers used in manufacturing integrated circuits and the like, it is typically necessary to remove chemicals or residues from the wafer surface. For example, it is sometimes necessary to etch openings or other geometries into a thin film deposited onto (or grown on) the surface of a wafer substrate. (The wafer substrate typically comprises silicon, gallium arsenide, glass, an insulating material such as sapphire, or any other substrate material upon which an integrated circuit wafer may be fabricated.) Present methodology for etching such a thin film requires that the film be exposed to a chemical etching agent to remove desired portions of the film or films. The composition of the etching agent used to remove the portion of the film depends upon the nature of the thin film.

In order to ensure that only desired portions of the thin film are removed, a photolithography process is use by which a pattern is transferred to the surface of the thin film. The pattern serves to identify the areas of the thin film that are to be selectively removed. The pattern is typically formed with a photoresist material, typically a light-sensitive material that is spun onto the in-process integrated-circuit wafer also in the form of a thin film. The thin film of photoresist is then exposed to a high intensity light source that is projected through a photomask. The photomask defines a desired pattern. As the light source is projected through the photomask, the desired pattern is defined on the photoresist thin film. The exposed or unexposed photoresist, depending upon the polarity of the photoresist material, is dissolved (i.e., is removed or stripped) with developers, leaving a pattern that allows etching to take place in the selected areas only.

Some of the current methods for stripping the photoresist (or other materials, such as dry-etch residues or polymers) include a hot chemical removal with a chemical etching agent. Sulfuric acid and hydrogen peroxide or dry reactive removal, known as photoresist ashing are typical removal methods. The hot chemical removal methods are undesirable in that they involve great expense due to the relatively large amount of chemical etching agent needed and require expensive disposal methods due to the caustic nature of the chemical etching agents. The ashing method is undesirable in that it involves a high-energy gas and often incurs damage to the wafer substrate or the layers of thin films formed on the wafer substrate to make the wafer integrated circuits.

Some chemicals in the gaseous phase may react with photoresist material or other such materials to facilitate removal of the materials from the wafer surface. Many of such gases, however, do not have effective transport means to the wafer surface to effect the necessary reaction in a reasonable period of time. Also, many such gases are too unstable to be introduced to the wafer in an atmosphere filled with such gas and effect the necessary reaction with the photoresist material. Such gases typically have short half-lives and change in structure in such environments so quickly that the gas is unable to react with a thin film material on the surface of a wafer. Many such gases (both the unstable gases and those lacking sufficient transport characteristics), however, are sufficiently soluble in a variety of liquid solvents.

For example, there has been a current interest in the use of ozone (i.e., $O_3$) as a photoresist etching agent for the stripping of photoresist, dry etch residues/polymers, and the like from a wafer surface. Ozone reacts with photoresist material on the wafer surface to oxidize the photoresist (forming $CO_2$). Ozone, however, is an unstable gas and will decompose before reacting with the wafer surface photoresist material if simply introduced in its gaseous state. Accordingly, a solvent is used to dissolve the ozone and transport the ozone to the wafer surface such that the ozone may react with the photoresist material and strip the photoresist material from the wafer surface.

Water may act as a solvent to dissolve ozone. One method for use of ozone as a stripping agent involves immersing the in-process wafer into a water bath through which ozone is bubbled. It is difficult, however, to get a sufficient amount of ozone dissolved in the water to affect the desired oxidation reactions. Further, the amount of ozone transported to the wafer surface is limited due to the large amount of water filling the bath. Consequently, the stripping process is very slow.

Without being tied to any particular theory, it is believed that a main barrier to dissolution of the gas into water is kinetic in nature. Another method calls for chilling a water bath and using a diffusion plate in the water to bubble ozone gas therethough. The diffusion plate creates numerous tiny bubbles that rise through the water. The wafers are then immersed in the water bath. During this residence time, the gas dissolves in the liquid by crossing the gas/liquid interface so that the ozone in the water strips the photoresist (or other material) on the wafer. Other methods for dissolving the gas into the liquid (e.g., water) include the use of static mixing devices and membrane contactors.

This method, however, relies heavily on the configuration and performance of the diffusion devices (e.g., the diffusion plate in the water bath) and requires long time periods of exposure of the gas to the water. The increased time and the need for diffusion apparatus add undesirable time and complexity to the process. Further, the photoresist stripping effectiveness of such processes is limited, as discussed above, as only a small amount of ozone moves to (i.e., has physical contact with) the surface of the wafer while the wafer is immersed in the water bath.

Accordingly, methods and apparatus are needed to fabricate and/or clean wafers without incurring the expense and apparatus complexity encountered with the prior art methods and apparatus. Additionally, methods and apparatus are needed that provide effective stripping of photoresist, dry etch residues/polymers, or the like in a reasonably short time period. Further, methods and apparatus are needed that can overcome the kinetic limitation to dissolution of a gas in a liquid without the need for long exposure times of the gas to the liquid.

To overcome the disadvantages of the prior art, methods and apparatus are disclosed herein. The methods and apparatus provided eliminate the need for large amounts of caustic chemical cleaning agents to remove photoresist, dry etch residues/polymers, or the like. The methods and apparatus provided also require only a relatively small amount of gas and liquid to strip the photoresist, dry-etch residues/ polymers, or the like. Additionally, the methods and apparatus overcome the kinetic limitation of dissolution of the gas in the liquid without requiring long exposure times of the gas to the liquid. Further, the methods and apparatus provide a liquid solvent that effectively transports the reactant gases that most effectively and quickly strip photoresist material (or other material) from a wafer surface. The liquid solvent, however, does not react with materials on the wafer surface, but merely acts as a transport medium to put the reactant gas in physical contact with the wafer surface.

More specifically, an in-process wafer is placed in a chamber, preferably a chamber of low volume. A liquid solvent (e.g., water) incorporates (e.g., dissolves) a reactant gas (e.g., ozone) to create a "reactant mixture." The reactant gas in the mixture will react with and remove photoresist material (or other material) on the wafer surface. In one representative method, the reactant mixture enters the chamber and forms a thin film on one or more surfaces of the wafer. The chamber preferably includes a reactant gas atmosphere during and/or after formation of the thin film. The solvent acts as a transport medium to place the reactant gas in direct physical contact with the wafer surface. The reactant gas is then able to react with the photoresist material (dry etch residue/polymer or the like) on the in-process wafer surface to effect removal of the material. The solvent does not react with the photoresist material (or other material at issue) to be removed nor with the reactant gas. The solvent acts merely to transport a sufficient amount of the reactant gas to the wafer surface such that the gas reacts with the photoresist material to effect removal.

For example, ozone (i.e., a reactant gas for conventional photoresist material) dissolves in water (i.e., an ozone solvent or "transport medium") to form a reactant mixture. The reactant mixture condenses to form a thin layer on one or more wafer surfaces. The ozone reacts with the photoresist to form $CO_2$. The water does not react with the photoresist (or the ozone), but merely transports a sufficient amount of the ozone gas to the wafer surface so that the ozone gas reacts with the photoresist to effect removal in a relatively short period of time. Following reaction with the photoresist, the layer of reactant mixture is removed from the wafer surface by flash heating, rinsing, drained, or other suitable removal method.

In the representative methods and apparatus, the reactant mixture condenses or otherwise collects on the wafer surface to form a thin film thereon. The high surface area to volume ratio of the thin film reactant mixture results in transport of a relatively high volume or concentration of reactant gas directly onto the wafer surface. Accordingly, the removal of photoresist (or the like) from the wafer surface occurs relatively rapidly. The methods and apparatus allow the removal process to be carried out in a low volume chamber requiring a minimal amount of reactant gas and solvent. Additionally, both the reactant gas and the solvent may be purified and re-circulated during the wafer fabrication process, thereby wasting little chemical and having little chemical waste for which disposal is necessary.

The foregoing features and advantages of the methods and apparatus will become more apparent from the following detailed description of representative methods and apparatus that proceed with reference to the accompanying drawings. The present invention is directed toward novel and non-obvious features and advantages of the disclosed methods/apparatus for fabricating and cleaning in-process wafers, both individually and collectively, as set forth above and additionally as set forth in the drawings and description following.

DETAILED DESCRIPTION OF THE INVENTION

Methods and apparatus for removing photoresist material, dry etch residues/polymers, and like materials from an in-process wafer, are provided. For ease of discussion, the methods and apparatus are primarily discussed in terms of the stripping of photoresist from an in-process wafer surface. It should be understood that the methods and apparatus may be used to remove a variety of materials and residues from wafer surfaces and are not limited to the stripping of photoresist material. Further, reactant gases and liquid solvents useful for practicing the methods are primarily discussed in terms of ozone in water. It should be understood that a variety of reactant gases (including mixtures of gases) and liquid solvents (as discussed below) may be use to practice the invention.

In general, an in-process wafer is placed within a chamber. A reactant gas is incorporated into a solvent (for example, the liquid solvent may dissolve the reactant gas) to form a "reactant mixture" that is capable of reacting with the photoresist material to facilitate removal of the photoresist material from the wafer surface.

Figure 4:
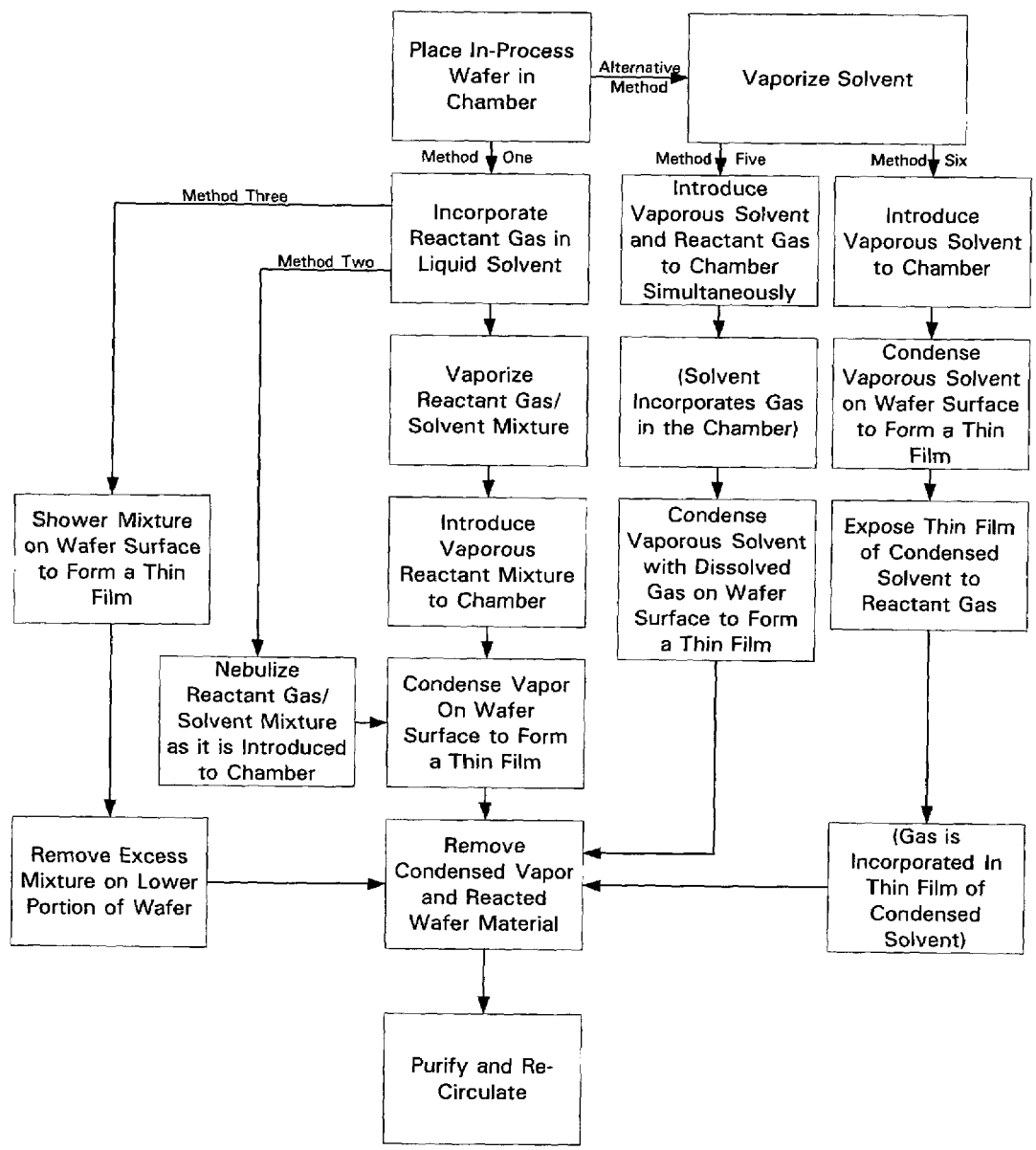
FIG. 4 is a flow diagram illustrating a number of representative methods.

A number of the representative methods are illustrated in outline form in FIG. 4. In one representative method, the reactant mixture enters the chamber in the vapor phase. A vapor is a gas at a temperature below the critical temperature. The vapor phase reactant mixture condenses on one or more of the in-process wafer surfaces to form a thin film or layer on the surface(s) of the wafer. The solvent acts as a transport medium to place the reactant gas on the wafer surface(s). The reactant gas is then able to react with the photoresist material on the in-process wafer surface to effect removal of the material. Following reaction of the reactant gas with the photoresist, the condensed reactant mixture is removed from the wafer surface by flash heating, rinsing, draining, or other suitable method. The process preferably takes place in a reactant gas atmosphere. Alternatively, preferably the process includes flowing a stream of reactant gas over the thin film.

Figure 1:
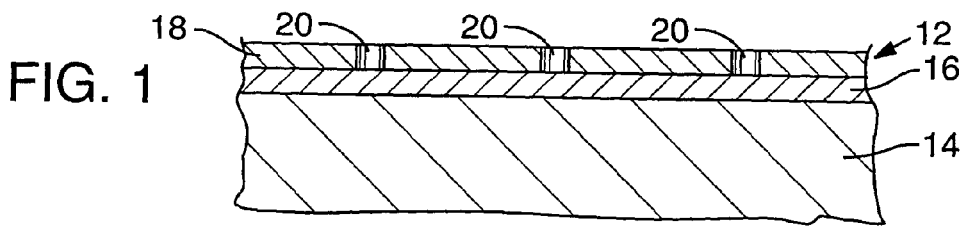
FIG. 1 is a partial cross-sectional view of an in-process wafer.

More specifically, a first representative method includes stripping photoresist material from an upper, such as the wafer shown in FIG. 1. A typical, in-process wafer 12 is being formed on a substrate 14, such as a silicon substrate. A film 16 is deposited on the substrate 14. A layer of photoresist material 18 is applied on film 16. The photoresist material 18 is exposed and developed, patterning openings 20. Openings 20 allow subsequent, selective etching of film 16. The photoresist material 18 then needs to be stripped from the in-process wafer 12.

Figure 2:
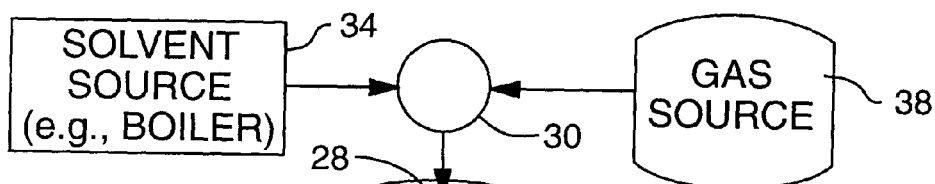
FIG. 2 is a cross-sectional view of a closed reaction chamber including in-process wafers therein which wafers are undergoing one step of a photoresist stripping method.
Figure 2:
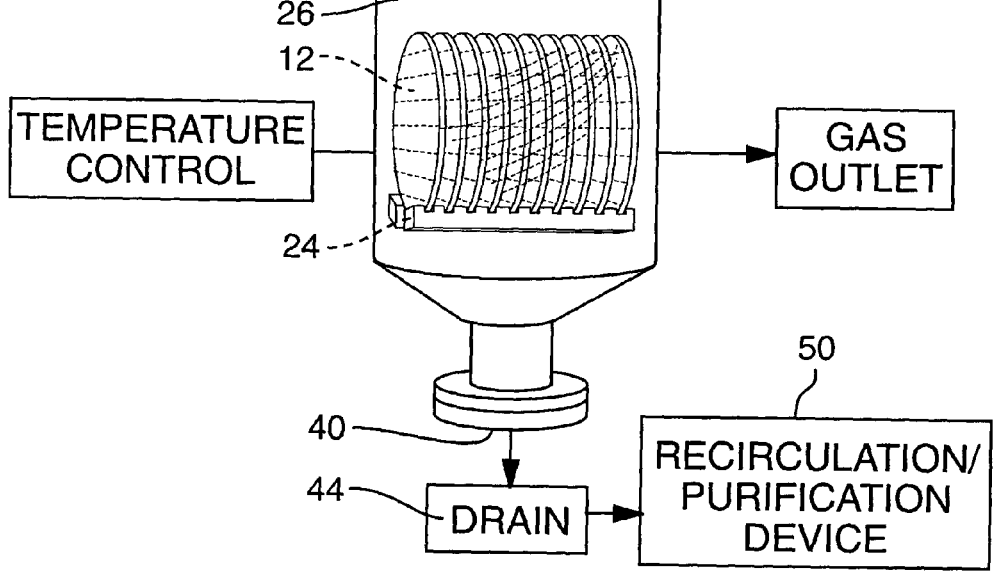

Accordingly, in a first method, in-process wafers 12 are placed into a chamber 10 of an apparatus such as is shown in FIG. 2. The embodiment of the reaction chamber 10 shown in FIG. 2 includes in-process wafers 12 positioned on the interior 26 of the chamber. The in-process wafers 12 are, preferably placed in a boat 24 that supports the wafers in a vertical position. Alternatively, a boat or other holder may support the wafers 12 in a horizontal position, or any other position that allows access to the surface of the wafer 12 to be treated.

Chamber 10 is preferably closed to form a controlled environment such that its contents are not exposed to the ambient atmosphere. Thus, contaminants, such as oxygen, cannot contact the surface of the in-process wafers 12. Alternatively, chamber 10 may comprise a module (or separate modules) within a tool cluster. A top chamber opening 28 communicates on an upstream side of the chamber with a valve 30 and on a downstream side with the interior 26 of the chamber 10. Valve 30 is fluidly connected to a solvent source 34 and to a reactant gas source 38. Solvent source 34 may comprise, e.g., a boiler. A bottom chamber opening 40 fluidly communicates with a drain 44 that is connected to a re-circulation/purification device, as discussed below. A gas outlet is located at the bottom of the chamber. A temperature controller, for controlling the temperature of the interior 26 of the chamber and/or the wafers 12 in the chamber is connected thereto.

A reactant gas (e.g., ozone) is then dissolved in a liquid solvent (e.g., water). The reactant gas comprises a gas or a mixture of gases capable of reacting directly with the photoresist material (or other material) on an in-process wafer surface to remove the photoresist material therefrom. Typically, the reactant gases are unstable unless dissolved in a solvent. The gases also include those gases that are stable but are not transported effectively in sufficient concentration to a wafer surface because the gas molecules do not remain in physical contact with the wafer surface long enough to react with the photoresist material thereon.

The solvents are those liquids that dissolve or otherwise incorporate a suitable concentration of the reactant gas. The solvents also are capable of forming a film of liquid (or condensate) on a wafer surface. For example, most any perfluorocarbon will dissolve the reactant gas ozone. The solvent, however is merely a transport medium for the reactant gas and does not react with the photoresist material (or other material) on the wafer surface. The solvent may comprise a single solvent or a mixture of solvents.

In the first method, the reactant gas is first dissolved in the solvent to form a "reactant mixture." The reactant mixture is vaporized (i.e., volatilized) and introduced to the chamber 10 through upper chamber opening 28. In such a case, the solvent source 34 also includes a dissolved gas in the solvent. The concentration of the gas in the solvent is preferably at least from about 10% to about 95% gas to solvent by volume. In general, the concentration of the reactant gas in the solvent should be as high as possible because higher reactant gas concentrations strip the photoresist material more quickly than do reactant mixtures having lower reactant gas concentrations.

The vaporous reactant mixture enters the interior 26 of the chamber 10 to condense on one or both surfaces of the in-process wafer 12 to form a film or layer thereon. To ensure the vaporous reactant mixture condenses to form a film or layer on the in-process wafer 12, the wafer may be cooled to a temperature equal to about the dew point of the solvent. At such a temperature, a thin film of the reactant mixture will form on one or more wafer surfaces. Alternatively, the wafer 12 may be at ambient temperature, but with ambient temperature being a temperature that is lower than the temperature of the reactant mixture. Good results are achieved when the wafer is at a temperature of about 10° C. lower than the temperature of the reactant mixture. Under such conditions, the reactant mixture condenses on one or more of the wafer surfaces. The wafer preferably is not cooled to a temperature that would freeze the solvent as freezing may interfere with the transport characteristics of the solvent.

In the representative methods, the film or layer of reactant mixture formed on the in-process wafer 12 surface(s) is preferably from about 1 $\mu$m to about 100 $\mu$m in thickness. At a higher thickness, the reaction process slows. A thin film of about 2000 $\mu$m to about 3000 $\mu$m in thickness tends to cause a relatively, slow reaction process (likely to be about ten times slower than that of a thin film having a thickness of about 100 $\mu$m). The reaction time is also slower at lower temperatures, as would be expected.

The reactant gas in the thin film reactant mixture reacts with the photoresist (or other material) in a relatively short time. Typically, the reactant gas sufficiently reacts with the photoresist material in about five minutes for a thin film layer having a thickness of about 100 $\mu$m and a reactant gas concentration of about 10 percent gas by volume. If the thin film is thicker, the reaction time period is longer to ensure sufficient removal of the photoresist.

In the first method (as well as the representative methods discussed below), the process preferably takes place in an atmosphere of reactant gas. Alternatively, preferably the process includes flowing a reactant gas stream over the film or layer.

Following reaction of the reactant gas with the photoresist (or other material to be removed), the reactant mixture thin film is removed. The reactant mixture thin film material is removed from the wafer surface(s) by heating the wafer or heating the wafer environment (preferably in hot nitrogen gas). Alternatively, the reactant mixture thin film material may be removed by rinsing the wafer 12, allowing the thin film to drip off the wafer 12, or any other suitable manner (dependent upon the nature of the wafer at issue).

In a second representative method, the reactant mixture is introduced to the interior 26 of the chamber 10 in the liquid phase by a nebulizer 32 in the chamber 10. The nebulizer 32 may comprise an ultrasonic nebulizer or any other suitable device for forming a fine mist of the reactant mixture. The nebulizer 32 creates a fine mist of tiny reactant mixture droplets. The droplets may be of any suitable size to condense on and form a thin film on the surface of an in-process wafer 12. In one embodiment, the nebulizer 32 produces reactant mixture droplets at about the Meinhardt droplet size (i.e., about 10 $\mu$m to about 50 $\mu$m). A nebulizer mist reactant mixture then condenses on one or more of the wafer 12 surfaces. At this point, the second method follows the method outlined above in relation to the first method (see FIG. 4).

In a third method, the reactant mixture enters the chamber 10 through a shower device 46 positioned at upper chamber opening 28 of the reactant mixture. The reactant mixture is not in a vapor phase, but "drips" in the liquid phase from the shower device 46 to the vertically positioned in-process wafers 12. The dripping reactant mixture forms a thin film on the surface of the wafer 12. With such a method, a thicker layer of reactant mixture tends to form on the lower portion of the vertically positioned wafer (due to gravity).

To ensure the desired thin film layer thickness over the entire wafer surface, a hydrophilic material may be put in physical contact with the lower portion of the wafer to remove excess reactant mixture therefrom (thereby ensuring a thin film of suitable thickness remains on the wafer surface). Alternatively, the excess reactant mixture may be allowed to simply drip off of the wafer surface. A thinner film is desirable however, as the thinner film enables a quicker reaction of the reactant gas with the photoresist material, thereby increasing production throughput. When using the shower apparatus to form a thin film of the reactant mixture on a wafer surface, the wafer is preferably at a temperature equal to about 25° C. while the reactant mixture is preferably at a temperature equal to about 90° C. At this point, the third method follows the method outlined above in relation to the first method (see FIG. 4).

Figure 3:
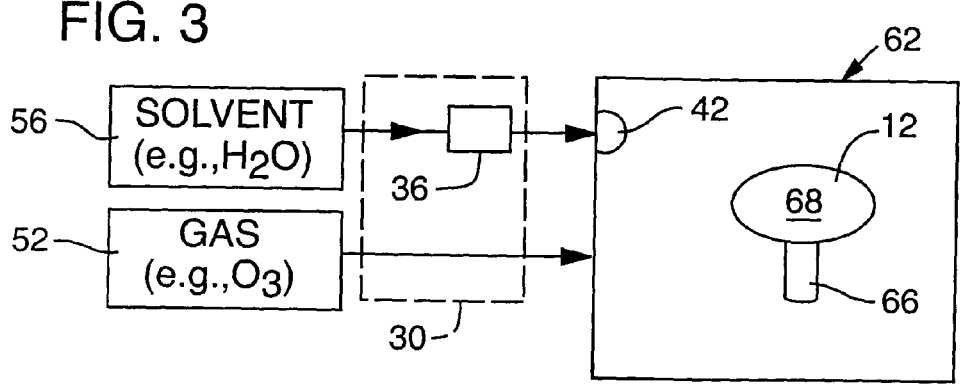
FIG. 3 is a general block diagram of a photoresist stripping system.

Referring to FIG. 3, in a fourth representative method, a reactant gas from gas source 52 is dissolved in a solvent from solvent source 56 to form a reactant mixture. The reactant mixture is then introduced to a chamber 62 via valve assembly 30. Valve assembly 30 may include a boiler 36 connected to the solvent source 26. Chamber 62 is preferably a closed chamber for the reasons discussed above in relation to the chamber 10 apparatus. An in-process wafer 12 is mounted on a spinner device 66. As the reactant mixture enters the chamber 62, the mixture is condensed on the wafer surface 68. The reactant mixture may pass through a mister or nebulizer 42 to form a mist of reactant mixture droplets. A film of reactant mixture is formed on the surface. The reactant mixture may be spun onto the wafer surface using any conventional spinner device, such as the spinner shown in FIG. 3 but this is not a preferred method. The speed of rotation of the wafer 12 would be used to control the thickness of the thin film of reactant mixture formed on the wafer surface 68. At this point, the fourth method follows the method outlined above in relation to the first method.

Referring back to FIG. 2, in a fifth representative method, the reactant gas from reactant gas source 38 is introduced to the chamber 10 simultaneously with the solvent from the solvent source 34. The solvent is introduced to the chamber 10 in the vaporous phase (or liquid phase) such that the reactant gas dissolves in the solvent to form the reactant mixture while in the chamber 10. The reactant mixture then condenses or otherwise forms on the wafer surface, to form a thin film thereon. The rest of the fifth method is carried out as described above in relation to method one (see FIG. 4).

In a sixth representative method, the solvent is vaporized and then condensed on the wafer 12 to form a film thereon. The liquid solvent need not be vaporized but may form a layer or film on the wafer by any suitable means (e.g., nebulizing, showering, etc.). The film of solvent is then exposed to an atmosphere of the reactant gas within the chamber 10. The reactant gas dissolves in the film of solvent and reacts with the photoresist (or other material) on the wafer. The rest of the sixth method is carried out as described above for the first method (see FIG. 4).

Lastly, in each of the methods described above, following removal of the reactant mixture thin film (along with removal of any residual photoresist or other material) the reactant mixture is drained through lower chamber opening 40 to a drain 44. Drain 44 may be connected to a re-circulation/purification device 50 wherein the gas and solvent are purified and re-circulated to be used for the next batch of wafers.

Whereas the invention has been described with reference to multiple embodiments of the apparatus and representative methods, it will be understood that the invention is not limited to those embodiments. On the contrary, the invention is intended to encompass all modifications, alternatives, and equivalents as may be included within the spirit and scope of the invention as defined by the appended claims. For example, to form a layer or thin film of solvent or reactant mixture on the wafer surface, the wafer may be dipped into a container of the respective liquid.

What is claimed is:

1. A method for semiconductor wafer fabrication, the method comprising:

incorporating a reactant gas that is capable of reacting with a material on the surface of a wafer into a liquid solvent that is inert to the material on the surface of the wafer to provide a reactant mixture;

forming a film of the reactant mixture on the surface of the wafer so that the reactant gas is transported through the film of reactant mixture to the surface of the wafer and reacts with the material thereon; and cooling the wafer to a temperature equal to or less than about a dew point of the liquid solvent in the reactant mixture to facilitate the formation of the film of the reactant mixture on the surface of the wafer.

2. The method of claim 1, wherein the reactant gas is inert with respect to the liquid solvent.

3. The method of claim 1, wherein the thin film of the reactant mixture has a thickness of from about 1 micron to about 100 microns.

4. The method of claim 1, further including flowing the reactant gas over the thin film of the reactant mixture such that some of the flowing reactant gas is transported through the film to the surface of the wafer.

5. A method for removing a material from a surface of a semiconductor wafer, the method comprising:

selecting a reactant gas capable of reacting with a material on a wafer surface;

condensing a liquid solvent onto a surface of the wafer from which material is to be removed, the liquid solvent being inert to the material on the wafer surface; and exposing the condensed liquid solvent to the reactant gas, the reactant gas being inert to the solvent and reacting with the material on the wafer surface to remove such material.

6. The method of claim 5, further including incorporating reactant gas into the liquid solvent to form a liquid solvent that comprises a reactant mixture that contains reactant gas, and wherein the step of condensing the liquid solvent comprises condensing the reactant mixture on a surface of the wafer such that the reactant gas reacts with and removes the material on the wafer surface.

7. The method of claim 5, further including removing the reactant mixture from the wafer surface.

8. A method for semiconductor wafer fabrication, the method comprising:

vaporizing a liquid solvent that is inert to a material on a surface of a wafer;

selecting a reactant gas that is capable of chemically reacting with the material on the surface of the wafer;

incorporating the reactant gas into the vaporized liquid solvent; and condensing the vaporized solvent incorporating the reactant gas to form a film on the surface of the wafer so that the reactant gas is transported through the film to the material on the surface of the wafer.

9. The method of claim 8, further including flowing the reactant gas over the film such that some of the flowing reactant gas is transported through the film to the surface of the wafer and cooling the vaporized liquid solvent to facilitate condensation of the vaporized liquid solvent on the surface of the wafer.

10. A method for removing photoresist material from the surface of the wafer, the method comprising:

vaporizing a mixture of water and ozone gas;

condensing a layer of the mixture on a wafer surface having photoresist material thereon; and reacting the ozone gas in the mixture with the photoresist material on the wafer surface to remove the photoresist material therefrom.

* * * * *